United States Patent [19]

Wouda et al.

[11] Patent Number: 4,920,530
[45] Date of Patent: Apr. 24, 1990

[54] ADAPTIVE TIME-DISCRETE FILTER FOR FORMING A CANCELLING SIGNAL FROM SYNCHRONOUS DATA SYMBOLS

[75] Inventors: Kornelis J. Wouda; Simon J. M. Tol, both of Hilversum, Netherlands

[73] Assignee: AT&T and Philips Telecommunications B.V., Hilversum, Netherlands

[21] Appl. No.: 132,293

[22] Filed: Dec. 15, 1987

[30] Foreign Application Priority Data

Dec. 22, 1986 [NL] Netherlands .................. 8603247

[51] Int. Cl.$^5$ ............................................. H04J 15/00
[52] U.S. Cl. .................... 370/32.1; 379/411; 333/18
[58] Field of Search .............. 370/24, 32.1, 123, 72; 333/18, 28 R; 379/410, 411

[56] References Cited

U.S. PATENT DOCUMENTS

| | | | |
|---|---|---|---|
| 4,303,895 | 12/1981 | Ohnishi et al. ............... | 333/18 |
| 4,467,441 | 8/1984 | Gritton ........................ | 370/32.1 |
| 4,539,675 | 9/1985 | Fisher ......................... | 370/32.1 |

Primary Examiner—Robert L. Griffin
Assistant Examiner—Frank M. Scutch, III
Attorney, Agent, or Firm—Lucian C. Canepa

[57] ABSTRACT

An adaptive time-discrete filter having an impulse response h(i) with i=0,1,2, . . . for forming a cancelling signal from synchronous data symbols (for example to cancel echoes or lagging intersymbol interference) comprises a transversal filter section (12) having adjustable coefficients $C_i$ with i=0,1,2, . . . , N−1 for realizing the first N values h(i) of the impulse response as well as a recursive filter section (12′) for realizing the values h(i) with i=N,N+1, . . . . The recursive filter section (12′) receives the input signal delayed over N−1 discrete time intervals from the adaptive filter as an input signal x(n) and forms an output signal y(n) according to the relationship:

$$y(n) = C_B[C_A \times (n-1) + y(n-1)]$$

where $C_A$ is equal to the last adjustable coefficient $C_{N-1}$ of the transversal filter section (12) and $C_B$ is a predetermined fixed coefficient.

4 Claims, 2 Drawing Sheets

ADAPTIVE TIME-DISCRETE FILTER FOR FORMING A CANCELLING SIGNAL FROM SYNCHRONOUS DATA SYMBOLS

The invention relates to an adaptive time-discrete filter having an impulse response h(i) with i=0,1,2, ... for forming a cancelling signal from synchronous data symbols, this filter comprising a transversal filter section having adjustable coefficients $C_i$ with i=0,1,2, ... , N−1 for realising the initial N values h(i) of the aforesaid impulse response, means for adaptively adjusting the filter coefficients $C_i$, a recursive filter section having coefficients for realising the values h(i) of the impulse response for i=N, N+1, ... , as well as means for summing the output signals of both filter sections for obtaining the cancelling signal.

BACKGROUND OF THE INVENTION

Such an adaptive time-discrete filter can be used in a transmission system suitable for full-duplex data transmission or otherwise as a feedback filter in a decision feedback equalizer (DFE), the filter being used for forming a cancelling signal for the "tail" of a received symbol, that is to say the remainder of the signal still received after the actual decision instant of the symbol due to imperfections in the transmission path and capable of disturbing the detection of the symbols coming thereafter, the so-called lagging intersymbol interference. Such a filter can further be used for forming an echo cancelling signal in a transceiver means for full-duplex data transmission over a two-wire circuit.

In two-way digital data transmission over a two-wire circuit, the use of an echo canceller is a necessity for realising an efficient full-duplex data transmission over a transmission channel having a relatively small bandwidth. The imperfections in the coupling of the transceiver means to the two-wire circuit and impedance discontinuities in the two-wire circuit itself result in a signal at the input of the receiver whose major component originates in the transmitted signal from the transmitter associated with the receiver, the echo signal. Reducing the received signal by a signal which is as true an approximation as possible of the trace of the signal transmitted by the associated transmitter, the echo cancelling signal, the actually received signal can be derived from the received signal notwithstanding the strong element of echo comprised therein. In such echo cancellers a transversal filter can be used capable of cancelling any linear combination of a certain number of previously transmitted symbols.

This way of echo cancellation is extensively described in the article by N. A. M. Verhoeckx et al: "Digital Echo Cancelling for Baseband Data Transmission", IEEE Trans. ASSP; Vol. ASSP-27, Nr. 6, December 1979, pp 768–781.

There is a drawback when using transversal filters in that for the echo cancelling of x preceding symbols a filter structure is needed comprising means for obtaining at least x successive versions of the input signal delayed each time over one extra symbol interval and having at least x coefficients. More specifically with echo signals having a long duration, for example an echo "tail" capable of still causing a significant disturbance even after 100 symbol intervals, this will lead to very complex and especially costly filter structures, among others due to the required memory capacity for all filter coefficients.

In duplex transmission over a two-wire circuit, the transceiver means is generally coupled to this circuit via a circuit comprising a transformer. This transformer is advisable for protecting the transceiver means from any high voltage peaks on the two-wire circuit and for converting the unbalanced transmitted signal into a balanced signal. Besides, the authorities controlling a two-wire transmission network generally demand the use of such a transformer for obtaining a balanced termination of the two-wire circuit.

As a result of the use of a transformer between the transceiver means and the two-wire circuit, the echo signal resulting from the imperfections in the coupling circuit can be regarded as a transmitted signal reaching the receive part via a channel having a frequency dependent response curve. More specifically, in data signals having a high energy content in the low-frequency portion of the spectrum this can lead to echo signals with an extremely long "tail", which means echo signals capable of causing a significant disturbance of the signal transferred via the two-wire circuit even after 100 symbol intervals. As elucidated hereinbefore, it is unattractive to cancel such echo signals of a duration of many dozens of sumbol intervals by means of a transversal filter.

Needless to observe that a line code can be used for the data signals having smaller energy contents in the low-frequency portion of the spectrum. The duration of the echo signal can thus be restricted. However, the adverse effect of such line codes for data signals will be a larger energy content in the high-frequency portion of the spectrum and consequently higher attenuation on transmission, which will restrict the applicability of such signals.

The duration of the echo-signal can also be restricted by means of linear equalizing techniques in the receive part. However, in a digital implementation of the transceiver means, digital word multiplications will have to be used resulting in a complex and consequently costly circuit.

Conversely, the use of a more refined two-wire-four-wire coupling (hybrid junction) will also achieve a shortening of the unintentionally long duration of the echo component. However, this solution will largely entail falling back on analog techniques, which is undesired, as in the currently used data transmission systems a complete integration of digital techniques in the transceiver arrangements is strived for.

There are filters which are able to produce with a limited number of coefficients a cancelling signal stretching out over a much longer period than the cancelling signal obtainable from a transversal filter with an identical number of coefficients. Such filters are known as recursive filters. If the filter coefficients of these filters are adjusted adaptively, however, the problem will arise that the stability of the filters is not guaranteed under all circumstances, which problem is not known when using transversal filters, and a further disadvantage of these recursive filters is that the required mechanism for adaptively adjusting the filter coefficients is harder to implement than with a transversal filter.

The article entitled "Untersuchungen und Entwürfe von hochintegrierbaren Echokompensationsverfahren zur Duplexübertragung" by S. Hentschke, published in Frequenz, Vol. 36, No. 11, pp 302–309, November 1982, has disclosed how a complete cancelling of an echo signal having a long duration can be achieved by combining a transversal filter with a recursive filter. It was suggested in the aforementioned article to cancel the echo signal of the most recently transmitted symbols, for example the last 32 symbols,, by means of an adaptive transversal filter and to cancel the echo signal coming from the send symbols, transmitted more than 32 symbol intervals before that by an adaptive recursive filter, the latter filter for example capable of containing four adaptive filter coefficients.

For this purpose the transmission signal is applied to an adaptive transversal filter having N=32 coefficients and the signal is likewise applied to the input of an adaptive recursive filter having four coefficients after attenuation over N=32 send symbol intervals. The echo cancelling signal is obtained by summing the output signal of the transversal filter and that of the recursive filter. The filter coefficients of the two filters are adjusted in a known way by means of an adaptive control loop deriving its control signal from the transmitted signal and the received signal, after the latter has been reduced by the echo cancelling signal.

A drawback of the known solution is that considerable problems will be encountered with respect to the stability of the echo cancelling filter, that the solution of two separate filter structures, each having a number of adaptively adjustable coefficients will require much storage capacity and consequently be very costly and that the found solution will needlessly be complicated.

Thereto the invention has for its object to find a solution for the abovedescribed problem which solution is neither complicated nor costly and, which does not know any problems of stability and nevertheless enables an optimum cancelling signal to be produced even with signals to be cancelled having a duration of many dozens of send symbol intervals.

SUMMARY OF THE INVENTION

The present invention provides an adaptive filter of the type mentioned in the preamble wherein the time-discrete input signal x(n) of the recursive filter section is formed by the adaptive filter input signal delayed over N−1 discrete time intervals and the recursive filter section is suitable for forming a time-discrete output signal y(n) having a relationship with the input signal x(n) as expressed in the following equation:

$$y(n) = C_B[C_A \times (n-1) + y(n-1)]$$

where $C_A$ is equal to the last adjustable coefficient $C_{N-1}$ of the transversal filter section and $C_B$ is a predetermined fixed coefficient.

If the adaptive filter according to the invention is used for forming an echo cancelling signal, the first part of the echo signal, that is to say that part coming from the N most recently transmitted symbols and which has an irregular pattern, is cancelled by means of a cancelling signal generated in the known way by an adaptive transversal filter having N coefficients. The "tail" of the echo signal, however, that is to say the echo signal of the send symbols transmitted prior to the N symbol intervals, is cancelled by an exponentially decreasing cancelling signal whose initial value is derived from the last coefficient of the transversal filter. For it has appeared that the "tail" of an echo signal, mainly resulting from the transformer in the hybrid junction between transceiver means and the two-wire circuit, decreases according to an exponential function and can be cancelled fairly simply in digital technique when selecting the right transformer self-inductance.

The aforementioned paragraph relating to the generation of the echo cancelling signal by means of the filter according to the invention mutatis mutandis relates to the use of the filter in decision feedback equalization (DFE). A received symbol too can have a "tail" extending to dozens of symbol intervals after the detection instant and which can be completely cancelled in an efficient way according to the invention partly by means of an adaptive transversal filter section and partly by means of a special recursive filter section.

Although the use of the filter in accordance with the invention for generating an echo cancelling signal will be explained hereinafter, it should be emphasized that the same favourable results are achieved when using the filter in a DFE circuit.

The great advantage of the solution suggested in this invention is that no stability problems will occur and that the extension of the adaptive transversal filter by a simple recursive filter section will not lead to an appreciable increase in complexity and/or costs.

BRIEF DESCRIPTION OF THE DRAWING

The invention will hereinbelow be further explained by means of an embodiment with reference to the drawing wherein.

DETAILED DESCRIPTION

Figure 1:
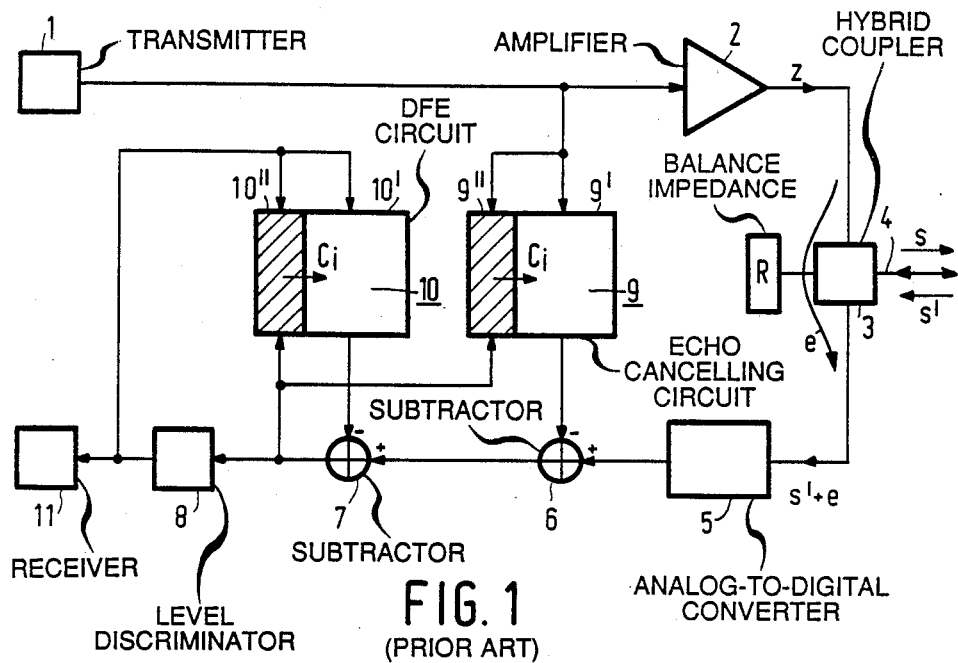
FIG. 1 shows a diagrammatic representation of a transceiver arrangement for full-duplex data transmission over a two-wire circuit.

FIG. 1 is a diagrammatic representation of a transceiver arrangement known per se for full-duplex data transmission over a two-wire circuit. The transit section of the system comprises a transmitter 1 and amplifier 2. The output signal of the amplifier 2 is applied to a hybrid coupler 3, providing the coupling between the four-wire transceiver arrangement and the two-wire circuit and which will be further discussed hereinbelow. Further connections to the hybrid coupler come from the balance impedance R and the input circuit of the receive section of the transceiver arrangement. Despite the fact that digital transmission is involved the signal received by the receive section via hybrid coupler 3, which can be considered an analog signal due to the effect of transmission line 4, is applied via an analog-digital convertor 5 to a first input of a subtractor 6, whose further input receives the output signal from an echo cancelling circuit 9, which will be discussed hereinbelow. The output signal from subtractor 6 is applied to the input of a second subtractor 7 whose further input receives the output signal from a decision feedback equalization circuit (DFE) 10 which will likewise be discussed hereinbelow. The output signal of subtractor 7 is applied to a level discriminator 8. The echo cancelling circuit 9 comprises a first section 9' generating the actual echo cancelling signal in response to the transmitted signal from transmitter 1 applied to its input, and an adaptive adjusting circuit 9" designed for generating a signal in a manner known per se and in response to the applied transmitted signal and the output signal from subtractor 7 to adaptively adjust the coefficients used in section 9', so as to have the echo-cancelling signal continuously approach in the most practicable manner the actual echo signal received via the hybrid coupler 3. The DFE circuit 10 comprises a first section 10' generating the actual cancelling signal for the "tail" of the received symbols in response to a series of symbols already received and applied to the DFE circuit from the output of discriminator 8, and an adaptive adjusting circuit 10" suitable for producing a signal in a known manner in response to the symbols already received and the output signal from subtractor 7 for adaptively adjusting the coefficients used in section 10' so as to have the cancelling signal produced by circuit 10 approach in the most practicable manner the "tail" of the symbol received most recently. After the received signal is reduced by each of the cancelling signals in the respective subtractors 6 and 7, a signal is obtained which is the best possible approximation of the actual signal transmitted via transmission line 4, which signal is applied to a receiver 11 via discriminator 8. Let it be assumed that a signal z is supplied via amplifier 2 to the hybrid coupler 3, a portion e, being the echo, of this signal z, is directly transmitted to the receive section of the transceiver arrangement via hybrid coupler 3, whilst another portion s of the transmitted signal is transmitted via the transmission line 4. Via this transmission line 4 also the signal s from the transceiver arrangement at the othr end of the transmission line 4 is received, so that the signal applied to the analog to digital convertor 6 by the hybrid coupler 3 is equal to s'+e.

Figure 2:
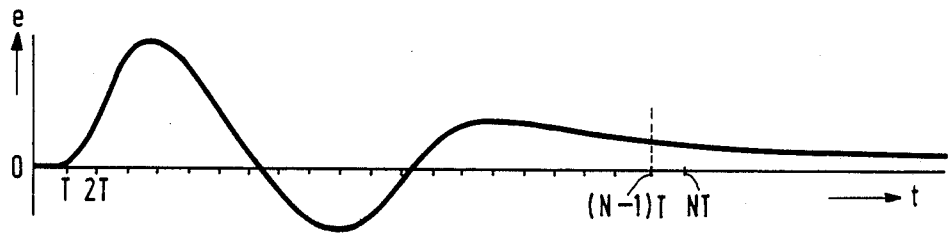
FIG. 2 shows a diagram of an echo signal which can occur in the arrangement as shown in FIG. 1.

If transmitter 1 transmits a signal z by way of a unit pulse having a duration of a symbol interval T, and let it be assumed that the actually received signal s' can be neglected with respect to the echo signal e generated by this unit pulse, the echo signal to be cancelled will appear to have roughly the form according to FIG. 2. In the interval from t=0 to t=(N−1)T, during which the echo signal to be cancelled has an irregular form, the signal shown in FIG. 2 can be cancelled in a known manner by means of an adaptive transversal filter. The signal in the interval from t=NT, however, roughly appears to correspond with the variation of a decreasing exponential function. Such a signal can be cancelled in a simple manner by means of a recursive filter of a very simple configuration and a single filter constant, whose value is selected such that the variation of the decreasing exponential function approaches the variation of the echo signal in the most practicable manner. All this will be further discussed with reference to FIGS. 3 and 4.

Figure 3A:
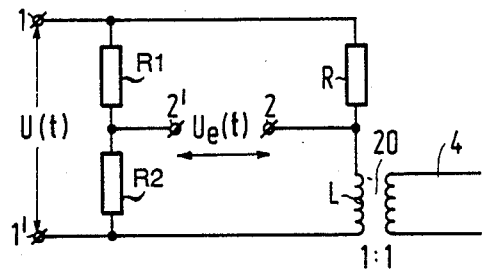
FIGS. 3a and 3b show a diagrammatic representation of the hybrid junction used in the arrangement as shown in FIG. 1.

FIG. 3a shows a diagrammatic representation of the hybrid coupler 3 designed in a bridge configuration. It comprises in the one bridge section the balance impedance having a value R and a 1:1 transformer 20 providing the actual coupling between the transceiver arrangement and the transmission line 4 and in the other bridge section two impedances R1 and R2 which have values equal to each other.

Between terminals 1 and 1' the transmitted signal z from amplifier 2 is received and between the terminals 2—2' are present the actually transmitted signal s' and the usually much stronger echo signal e. For the calculation hereinbelow it is assumed that s'=0, so that s'+e=e. It will further be assumed that the input impedance of the transmission line 4 approaches infinite, which is a justified approach for low frequencies.

Figure 3B:
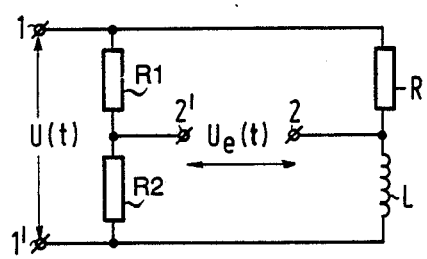

For very-low frequencies the diagram according to FIG. 3a of the hybrid coupler can be simplified to the diagram according to FIG. 3b, wherein L denotes the inductance of the primary winding of the transformer 20. If the transmitted signal z is a unit step U(t), it can be deduced from the diagram according to FIG. 3b that the echo signal e fulfills the condition of:

$$U_e(t) = [\exp(-Rt/L) - \tfrac{1}{2}]U(t) \qquad (1)$$

In this equation $U_e(t)$ denotes the voltage between the terminals 2—2' due to the echo signal.

From formula (1) it follows that the time constant of the circuit according to FIG. 3b and hence also that of FIG. 3a for very-low frequencies is given by $=L/R$.

Figure 4:
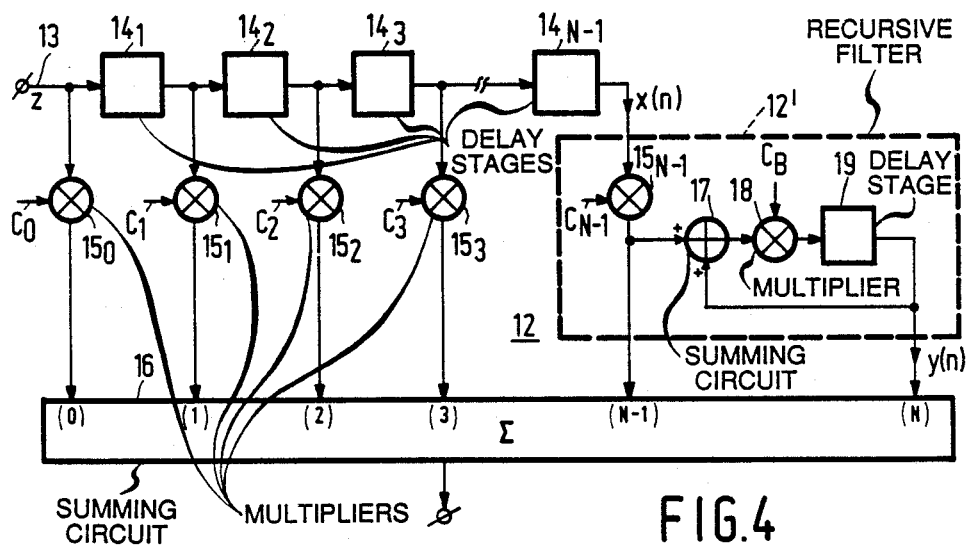
FIG. 4 shows a diagrammatic representation of the adaptive filter in accordance with the invention.

FIG. 4 diagrammatically shows a possible conceptual design of the actual filter section 9' of echo cancelling filter 9, comprising the adaptive filter according to the invention. The filter comprises a section 12 and a section 12' indicated by a dashed line. The section 12 forms a conventional adaptive transversal filter comprising a plurality of delay stages $14_1, 14_2, 14_3, \ldots, 14_{N-1}$, each delaying by the duration of one symbol interval the transmitted signal applied to input 13. The respective multipliers $15_0, 15_1, 15_2, 15_3, \ldots 15_{N-1}$ are constantly connected on the one side to the filter the input of 13 and delay stages $14_1 \ldots 14_{N-1}$, whilst on the other the multiplication coefficients $C_0, C_1, C_2, C_3, \ldots C_{N-1}$ are received. The value of these coefficients is adaptively adjusted in the known manner via the adaptive control loop shown in FIG. 1. The output signals of all multipliers are applied to the respective inputs (0) ... (N−1) of a single summing circuit 16 producing an output signal approaching in the best possible way the echo signal of the N symbols transmitted earlier. The transversal filter 12 needs no further discussion as its operation and configuration do not differ from the widely known transversal filters.

According to the invention the echo cancelling filter likewise comprises the section 12' denoted by a dashed line in FIG. 4. The filter configuration denoted by reference numeral 12' forms a recursive filter having two filter coefficients. The recursive filter 12' receives the signal from the last delay stage $14_{N-1}$ of the transversal filter 12 as an input signal after this signal has been multiplied by the associated adjustable coefficients $C_{N-1}$. Consequently, the first adjustable coefficient $C_A$ of the recursive filter 12' is determined by this coefficient $C_{N-1}$. This allows the output signal of multiplier $15_{N-1}$ to be applied directly to one input of a summing circuit 17. The output signal of this summing circuit is applied to a multiplier 18 multiplying this signal by a second, fixed coefficient $C_B$ of the recursive filter. Subsequently, the output signal of the multiplier 18 is applied to a delay stage 19, wherein the signal is delayed for a period of 1 transmission symbol interval. The output signal of delay stage 19 is applied to the last input (N) of the summing circuit 16 and also to a second input of summing circuit 17. For the time-discrete output signal y(n) of the recursive filter 12' the following condition holds:

$$y(n) = C_B[C_A \times (n-1) + y(n-1)] \qquad (2)$$

where x(n) is the time-discrete input signal of the recursive filter and $C_A = C_{N-1}$. Selecting the value of the constant $C_B$ such that in good approximation the following condition is fulfilled $C_B = \exp(-RT/L)$ where R is the terminating impedance of hybrid coupler 3, L is the inductance of the primary winding of the transformer 20 in hybrid coupler 3 and T is the send symbol interval, the recursive filter section 12' appears to yield an excellent approximation of the echo cancelling signal for the interval from $t=(N-1)T$.

As the values of R, L and T are known, the vaue of $C_B$ is known likewise. To be able to implement this coefficient value in a simple way in a digital circuit, a preferred embodiment of the invention $C_B$ is selected such that $$C_B = \exp(-RT/L) = 1 - 2^{-m} \qquad (3)$$

where m is a positive integer.

Since the values of R and T are fixed, making the right choice of inductance value L can indeed lead to m being a positive integer.

A multiplication by a coefficient of the form of $C_B = 1 - 2^{-m}$ can also be made in a simple way for a signal comprising more bits by means of a single shift over m bits and a single addition, which operations are easy to implement in digital technique.

What is claimed is:

1. An adaptive time-discrete filter having an impulse response $h(i)$ with $i=0, 1, 2, \ldots$ for forming a cancelling signal from synchronous data symbols,, this filter comprising a transversal filter section having adjustable coefficients $C_i$ with $i=0,1,2,\ldots, N-1$ for realising the initial N values $h(i)$ of the aforesaid impulse response, means for adaptively adjusting the filter coefficients $C_i$, a recursive filter section having coefficients for realising the values $h(i)$ of the impulse response for $i=N, N+1, \ldots$, as well as means for summing the output signals of both filter sections for obtaining the cancelling signal, characterized in that the time-discrete input signal $x(n)$ of the recursive filter section is formed by the adaptive filter input signal delayed over $N-1$ discrete time intervals and the recursive filter section is suitable for forming a time-discrete output signal $y(n)$ having a relationship with the input signal $x(n)$ as expressed in the following equation $$y(n) = C_B[C_A \times (n-1) + y(n-1)]$$

where $C_A$ is equal to the last adjustable coefficient $C_{N-1}$ of the transversal filter section and $C_B$ is a predetermined fixed coefficient.

2. An adaptive time-discrete filter as claimed in claim 1 for a transceiver means for full-duplex transmission of data signals having a given symbol frequency over a two-wire circuit, this transceiver means comprising a hybrid coupler having a transformer to couple the transceiver means to the two-wire circuit, the transmitted signal in this hybrid coupler being applied to a network having a time constant that equals L/R, for low frequencies, where R represents a given resistance and L the inductance of the primary winding of the transformer, and the secondary winding of the transformer being connected to the two-wire circuit, characterized in that the value of the fixed coefficient $C_B$ is mainly equal to $\exp(-RT/L)$, where T is the discrete time interval.

3. An adaptive time-discrete filter as claimed in claim 2, characterized in that the fixed coefficient $C_B$ is equal to $1-2^{-m}$, where m is a positive integer.

4. An adaptive time-discrete filter as claimed in claim 1, for a transmission system wherein the transmitter and the receiver are connected via a channel to a response at least determined by a time constant for low frequencies, characterized in that the receiver comprises a decision feedback equalizer (DFE) wherein the adaptive filter is comprised as a feedback filter and in that the value of the fixed coefficient $C_B$ is mainly equal to $\exp(-RT/\tau)$, where R is a given resistance and T is the discrete time interval.

* * * * *